US006869011B2

United States Patent
Mitchell

(10) Patent No.: US 6,869,011 B2
(45) Date of Patent: Mar. 22, 2005

(54) APPARATUS AND METHOD FOR CONTROLLING AN ELECTRICAL SWITCH ARRAY

(75) Inventor: Michael Lane Mitchell, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 268 days.

(21) Appl. No.: 10/137,161

(22) Filed: May 2, 2002

(65) Prior Publication Data

US 2003/0206155 A1 Nov. 6, 2003

Related U.S. Application Data

(60) Provisional application No. 60/329,774, filed on Oct. 15, 2001.

(51) Int. Cl.[7] .................................................. G06C 7/02
(52) U.S. Cl. ............................. 235/145 R; 235/145 A; 235/146
(58) Field of Search ............................. 235/145 R, 146, 235/145 A, 98 B; 713/300–340; 345/172, 168, 211; 355/38–41, 67

(56) References Cited

U.S. PATENT DOCUMENTS

| | | | | |
|---|---|---|---|---|
| 5,189,403 A | * | 2/1993 | Franz et al. ................. 345/172 |
| 5,309,506 A | * | 5/1994 | Alexander ................ 379/93.02 |
| 6,040,821 A | * | 3/2000 | Franz et al. ................. 345/159 |
| 6,107,996 A | * | 8/2000 | Franz et al. ................. 345/172 |
| 6,331,850 B1 | * | 12/2001 | Olodort et al. ............. 345/168 |
| 6,563,434 B1 | * | 5/2003 | Olodort et al. ............... 341/22 |
| 6,625,649 B1 | * | 9/2003 | D'Souza et al. ............ 709/225 |
| 6,678,830 B1 | * | 1/2004 | Mustafa et al. ............. 713/310 |

OTHER PUBLICATIONS

IBM (NN76081027), Keyboard Test, Aug. 1976.*

* cited by examiner

Primary Examiner—Michael G. Lee
Assistant Examiner—Kimberly D. Nguyen
(74) Attorney, Agent, or Firm—W. Daniel Swayze, Jr.; W. James Brady; Frederick J. Telecky, Jr.

(57) ABSTRACT

An electrical switching apparatus configured for low power operation includes: (a) a plurality of switching devices arranged in a switching array permitting sensing of individual switching events by selected switching devices; (b) a switching control device coupled with the switching array that provides power to the switching array for sensing and for a first time interval after a first switching device is actuated. The control device identifies the first switching device during the first time interval and interrupts power to the switching array after the first time interval until the first switching device is deactuated. The control device provides power to the switching array for a second time interval after the first switching device is deactuated. The control device determines during the second time interval whether a second switching device other than the first switching device is actuated.

11 Claims, 3 Drawing Sheets

APPARATUS AND METHOD FOR CONTROLLING AN ELECTRICAL SWITCH ARRAY

This application claims priority under 35 USC § 119(e)(1) of provisional application Ser. No. 60/329,774, filed Oct. 15, 2001.

BACKGROUND OF THE INVENTION

The present invention is directed to electrical switch arrays, and especially to electrical keyswitch arrays, or keypads, of the sort used for portable devices, such as portable telephones, wireless telephones, personal digital assistant (PDA) devices and similar devices.

Often during use of such products a condition occurs where one or more keys is stuck or otherwise held in an actuated position. For example, a wireless phone in the bottom of a user's purse or in a user's pocket may have one or more of the keys in its keypad array inadvertently pressed and held down (i.e., in an actuated position) for a long period of time. Depending upon the circuit design and implementation of the keypad interface such a holding down of a keyswitch can draw power and cause excess current to flow. Excess current flow can prematurely drain the batteries in battery-operated products such as wireless phones, PDA devices and similar products.

Previous solutions to this problem of inadvertent current drain have involved having a microprocessor or similar computing device "wake up" the system from a "sleep" mode. The sleep mode is a mode in which only minimal activity is carried out by an apparatus in order that only minimal power is required so that minimal current drain occurs. The device is "awakened" periodically every 10–20 $\mu$sec (microseconds) and polling or other examination of the keypad is carried out to determine whether a key is being held down. If a key is determined to be held down, the device remains awake and processes the information imparted by the holding down of the key. The problem with such prior art solutions is that the required periodic "awakening" and the repeated polling consume a certain amount of power and therefore cause current drain that shortens battery life.

There is a need for an apparatus and method for controlling an electrical switch array that requires less power to operate than is required by presently available control apparatuses and methods.

SUMMARY OF THE INVENTION

An electrical switching apparatus configured for low power operation includes: (a) a plurality of switching devices arranged in a switching array permitting sensing of individual switching events by selected switching devices; (b) a switching control device coupled with the switching array that provides power to the switching array for sensing and for a first time interval after a first switching device is actuated. The control device identifies the first switching device during the first time interval and interrupts power to the switching array after the first time interval until the first switching device is deactuated. The control device provides power to the switching array for a second time interval after the first switching device is deactuated. The control device determines during the second time interval whether a second switching device other than the first switching device is actuated.

The preferred embodiment of the invention is configured to provide that the control device responds to a second switching device being actuated during the second time interval by identifying the second switching device during the second time interval. The control device then interrupts power to the switching array after the second time interval until the second switching device is deactuated. The invention may include an internal or an external time reference. The preferred embodiment of the invention employs an internal digitally controlled oscillator (DCO) for establishing timing for operation of the apparatus.

A method for operating an electrical switching apparatus that includes a plurality of switching devices arranged in a switching array configured to permit sensing of individual switching events by selected switching devices of the plurality of switching devices includes the steps of: (a) detecting when a first switching device is actuated; (b) providing power to the switching array for sensing and for a first time interval after the first switching device is actuated; (c) identifying the first switching device during the first time interval; (d) interrupting power to the switching array after the first time interval until the first switching device is deactuated; (e) providing power to the switching array for a second time interval after the first switching device is deactuated; and (f) determining during the second time interval whether a second switching device other than the first switching device is actuated.

Preferably, the method includes the further steps of: (g) when a second switching device is actuated during the second time interval, identifying the second switching device during the second time interval; (h) interrupting power to the switching array after the second time interval until the second switching device is deactuated; and (i) when no second switching device is actuated during the second time interval, restoring power to the switching array after the second time interval.

It is therefore an object of the present invention to provide an apparatus and method for controlling an electrical switch array that requires less power to operate than is required by presently available control apparatuses and methods.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

The preferred embodiment of the apparatus of the present invention employs a microprocessor device that responds to rising and falling edges of signals. In the illustrative descriptions presented herein the apparatus is described as having a first response to a rising signal edge and a second response to a falling signal edge. Those skilled in the art of microprocessor system design will readily recognize that such an implementation is only exemplary and that a microprocessor could as easily be employed to respond with the second response to a rising signal edge and the first response to a falling signal edge.

Figure 1:
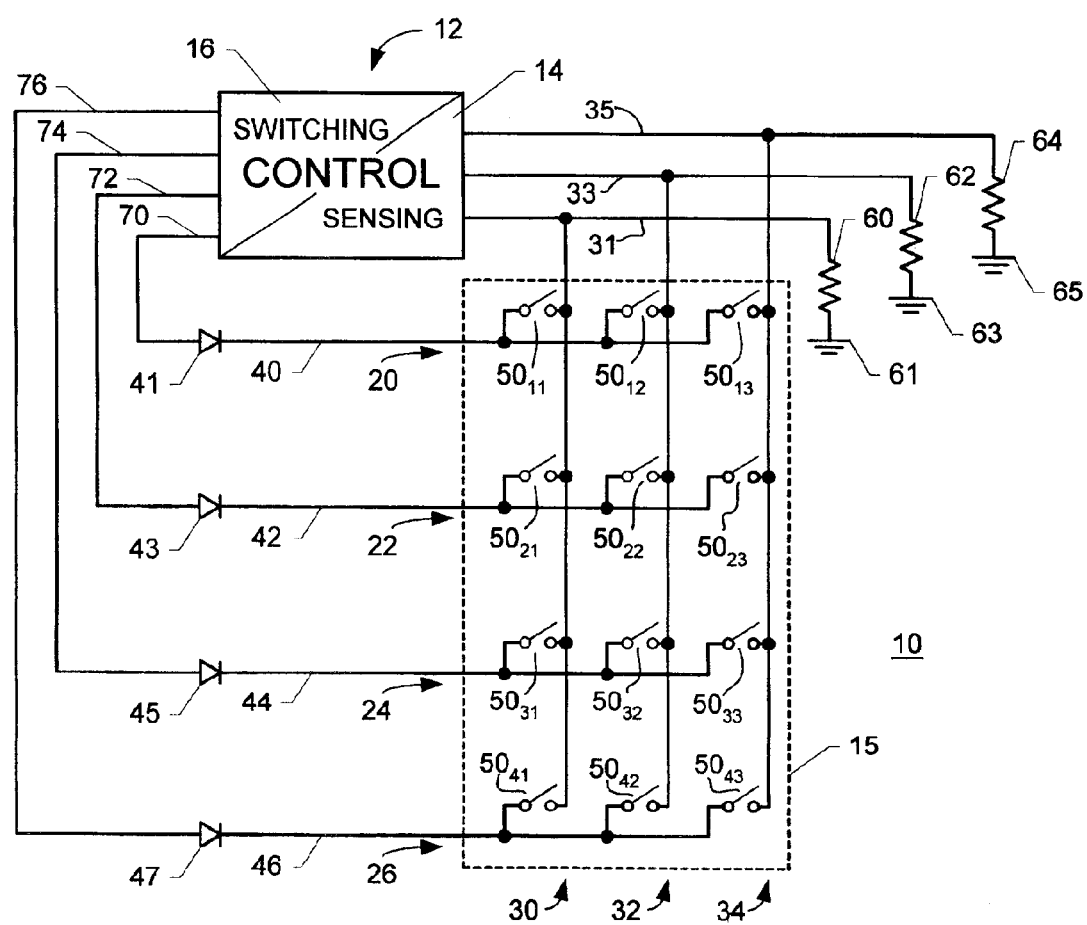
FIG. 1 is a schematic diagram illustrating the preferred embodiment of the present invention employed with an exemplary keyswitch array.

FIG. 1 is a schematic diagram illustrating the preferred embodiment of the present invention employed with an exemplary keyswitch array. In FIG. 1, a system 10 includes a control unit 12 and an electrical switch array 15. Electrical switch array 15 is arranged in a plurality of rows n, such as rows 20, 22, 24, 26 and a plurality of columns m, such as columns 30, 32, 34. A plurality of switches $50_{nm}$ is connected in switch array 15 with each respective switch $50_{nm}$ being coupled at a locus identifiable by a unique (row n, column m) combination. Thus electrical switch array 15 includes switches $50_{11}$ (row 1, column 1), $50_{12}$ (row 1, column 2), $50_{13}$ (row 1, column 3) in row 20. Electrical switch array 15 further includes switches $50_{21}$ (row 2, column 1), $50_{22}$ (row 2, column 2), $50_{23}$ (row 2, column 3) in row 22. Electrical switch array 15 further includes switches $50_{31}$ (row 3, column 1), $50_{32}$ (row 3, column 2), $50_{33}$ (row 3, column 3) in row 24. Electrical switch array 15 further includes switches $50_{41}$ (row 4, column 1), $50_{42}$ (row 4, column 2), $50_{43}$ (row 4, column 3) in row 26.

Row 20 is coupled with control unit 12 via a line 40, a serially connected diode element 41 and a line 70. Row 22 is coupled with control unit 12 via a line 42, a serially connected diode element 43 and a line 72. Row 24 is coupled with control unit 12 via a line 44, a serially connected diode element 45 and a line 74. Row 26 is coupled with control unit 12 via a line 46, a serially connected diode element 47 and a line 76.

Column 30 is coupled with control unit 12 via a line 31; line 31 is also coupled with ground 61 via a serially connected impedance 60. Column 32 is coupled with control unit 12 via a line 33; line 33 is also coupled with ground 63 via a serially connected impedance 62. Column 34 is coupled with control unit 12 via a line 35; line 35 is also coupled with ground 65 via a serially connected impedance 64.

Control unit 12 includes a sensing portion 14 and a switching portion 16. Control unit 12 is configured (as by, for example, including a microprocessor device, not shown in detail in FIG. 1) to maintain system 10 in a low power mode, commonly referred to as a "sleep" mode in which only minimal power is consumed, until a signal edge from one of the switches $50_{nm}$ is sensed by sensing portion 14 via a line 31, 33, 35. When a signal edge, for example a rising edge, is sensed by sensing portion 14, control unit 12 "wakes up" because system 10 is configured so that a rising signal edge indicates that a first-actuated switch $50_{nm1}$ is pressed, or actuated. That is, switching portion 16 of control unit 12 switchingly connects switch array 15 to power in order that control unit 12 may isolate the particular (row n, column m) locus at which first-actuated switch $50_{nm1}$ is situated. Preferably control unit 12 will delay a predetermined time interval in order to assure that debouncing or other settling of signals from first-actuated switch $50_{nm1}$ is complete so that spurious signals may be avoided. A typical representative debounce interval is approximately 40–80 msec.

Control unit 12, by cooperation of sensing unit 14 and switching unit 16, isolates the (row n, column m) locus of first-actuated switch $50_{nm1}$ that generated the rising edge signal that "awoke" control unit 12. This isolation of (row n, column m) locus uniquely identifies first-actuated switch $50_{nm1}$, and that identity can be used for further processing in the host apparatus (not shown in FIG. 1) in which system 10 is employed, such as a wireless phone, a personal digital assistant (PDA) device or another host apparatus. When identification of first-actuated switch $50_{nm1}$ is complete, control unit 12 returns to a "sleep" mode until first-actuated switch $50_{nm1}$ is released, or deactuated. Releasing first-actuated switch $50_{nm1}$ generates another edge signal; in this exemplary illustration a falling edge signal is generated. When sensing portion 14 of control unit 12 detects that first-actuated switch $50_{nm1}$ is released, control unit 12 preferably "reawakens", imposes another debounce interval and then checks to see whether another second-actuated switch $50_{nm2}$ has been depressed while control unit 12 was awaiting deactuation of first-actuated switch $50_{nm1}$. If a second-actuated switch $50_{nm2}$ has been actuated, control unit 12 will identify second-actuated switch $50_{nm2}$ and proceed as before described in connection with first-actuated switch $50_{nm1}$. That is, control unit 12 identifies second-actuated switch $50_{nm2}$ and returns to "sleep" mode until another falling edge signal indicates that second-actuated switch $50_{nm2}$ is deactivated or released.

If no second switch has been actuated while control unit 12 was awaiting deactuation of first-actuated switch $50_{nm1}$, then control unit 12 returns to a "sleep" mode to await a rising edge signal indicating actuation of a second-actuated switch $50_{nm2}$.

The above described cycle of scanning switch array 15, detection of actuation of a switch $50_{nm}$ and identification of the (row n, column m) locus of the actuated switch $50_{nm}$ takes approximately 50 μsec. Thus, scanning, identification and debounce interval occupy approximately 40–80 msec. A typical typist or keyboard operator actuates keyswitches at a speed resulting in a depressed, or actuated time interval for a keyswitch of approximately 100–200 msec (milliseconds); a speed typist using a standard keyboard may be able to actuate keys at a speed resulting in a depressed time interval of 40–50 msec. The devices for which the preferred embodiment of the invention is used—portable devices such as wireless phones, PDA devices or similar devices—present small keyswitch arrays that are not conducive to actuation speeds as fast as may be encountered in the case of a typist using a standard keyboard. Thus, the duration of a depressed or actuated key is likely to be significantly longer than the 40–80 msec required for scanning, identification and debounce intervals expected when using the present invention.

In the preferred embodiment of the invention the required timing is effected using a digitally controlled oscillator (DCO). That is, timing is generated and controlled by a cooperative employment of software and supporting hardware, not a crystal. Using such a DCO-based timing source and control and not requiring even the small amount of power that is required for powering a crystal ensures that very little power is consumed while control unit 12 is in a "sleep" mode. Even during most of the interval when a switch is actuated, control unit 12 is in "sleep" mode in which only minimal power is consumed. The apparatus and method of the present invention is very power efficient.

Figure 2:
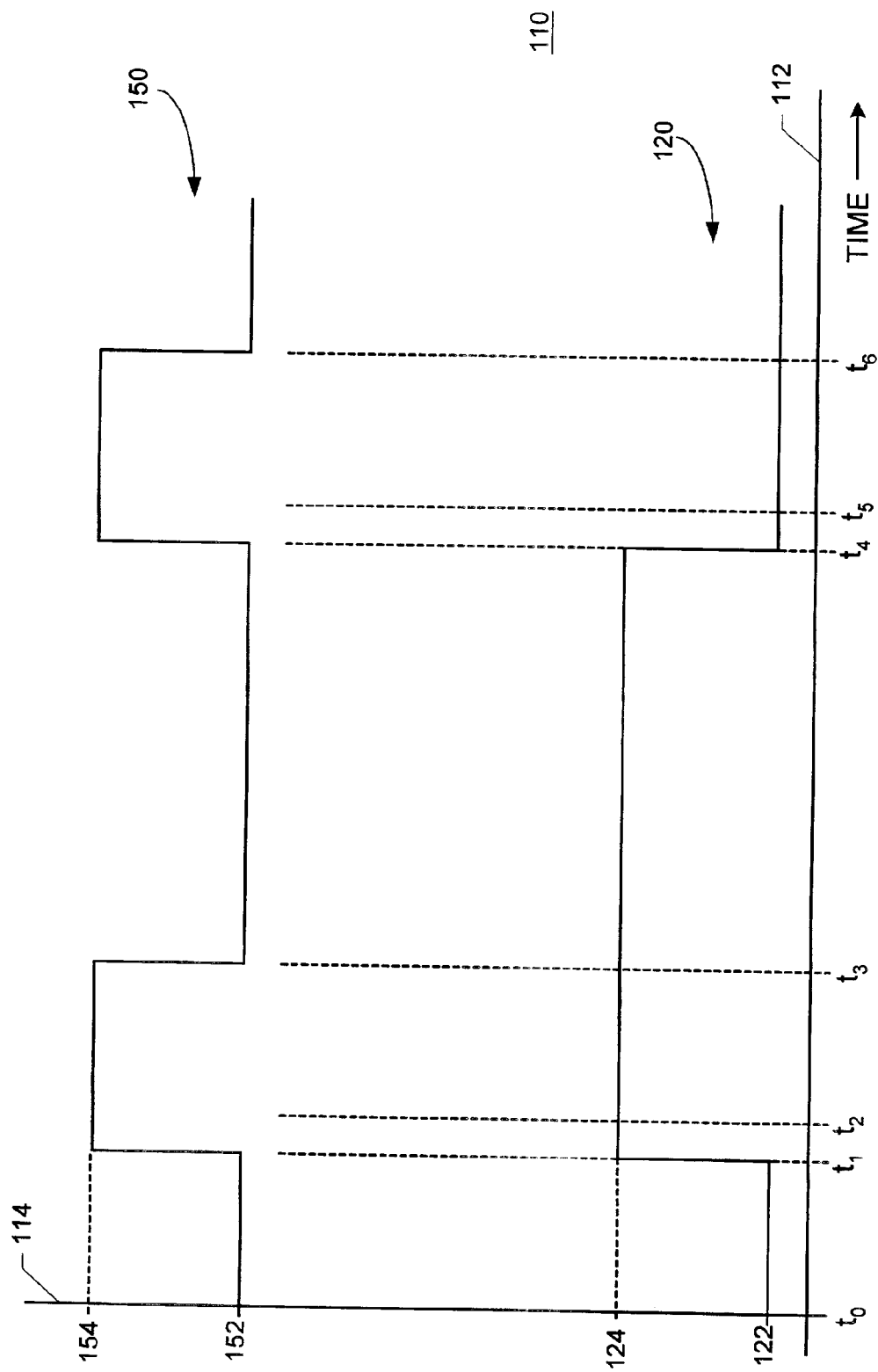
FIG. 2 illustrates selected timing diagrams associated with operation of the apparatus illustrated in FIG. 1.

FIG. 2 illustrates selected timing diagrams associated with operation of the apparatus illustrated in FIG. 1. In FIG. 2, a graphic plot 110 is illustrated including a first signal curve 120 representing a signal, such as voltage or current, sensed across keyswitch array 15 and a second signal curve 150 representing a signal, such as voltage or current, indicating the state of control unit 12 (FIG. 1). Signal curves 120, 150 are plotted against a common time axis 112 and an amplitude axis 114. Amplitude axis 114 may have separate parameter ranges for signal curves 120, 150 (not shown in FIG. 2). An important point to be illustrated by FIG. 2 is the mutual relationships of timing of signal curves 120, 150 during operation of apparatus 10 (FIG. 1).

During a time interval $t_0$–$t_1$, no keyswitch $50_{nm}$ is actuated in switch array 15; signal curve is at a first value 122 and signal curve 150 is at a first value 152. At a time $t_1$, a first keyswitch $50_{nm1}$ in switch array 15 actuated and signal curve 120 increases to a second value 124 greater than first value 122. The increase in value of signal curve 120 from first value 122 to second higher value 124 establishes a leading edge for signal curve 120 at time $t_1$. Control unit 12 is configured to recognize a leading edge pattern in signal curve 120 and reacts by "awakening" from "sleep" mode. Accordingly, signal curve 150 rises from a first value 152 to a second higher value 154 at time $t_1$. As described earlier in connection with FIG. 1, control unit 12 waits a short time interval $t_1$–$t_2$ to permit first keyswitch $50_{nm1}$ to debounce. During a remaining active interval $t_2$–$t_3$ for control unit 12, control unit 12 identifies which keyswitch is actuated first keyswitch $50_{nm1}$. The information identifying which keyswitch is actuated first keyswitch $50_{nm1}$ is passed on to a host apparatus (not shown in FIG. 1) for further use in operating the host apparatus such as dialing a phone number, entering data or for another function performed by the host apparatus.

At a time $t_3$, control unit 12 returns to "sleep" mode during which only minimal power is required for operating control unit 12; signal curve 150 returns to lower level 152. As mentioned earlier, control unit 12 preferably establishes timing using a digitally controlled oscillator (DCO) so that very little power is required by control unit 12 in its "sleep" mode and, indeed, in other operating modes as well.

Signal curve 150 remains at lower level 152 (i.e., control unit 12 remains in "sleep" mode) until first keyswitch $50_{nm1}$ is released, at a time $t_4$. Release of first keyswitch $50_{nm1}$ causes signal curve 120 to return to lower level 122 from higher level 124, thereby establishing a lagging edge for signal curve 120 at time $t_4$.

Control unit 12 remains in its "sleep" mode, as indicated by signal curve 150 remaining at lower level 152, until a lagging edge is detected in signal curve 120 at time $t_4$. Thus, at time $t_4$, signal curve 150 rises to higher level 154, indicating that control unit 12 has noted that first keyswitch $50_{nm1}$ is deactuated and control unit 12 has "awakened" from its "sleep" mode. Control unit 12 waits a short time interval $t_4$–$t_5$ to permit any second keyswitch $50_{nm2}$ that may have been actuated during the interval $t_3$–$t_4$ to debounce. During a remaining active interval $t_5$–$t_6$ for control unit 12, control unit 12 determines whether a second keyswitch $50_{nm2}$ is actuated and if so, identifying which keyswitch is the actuated second keyswitch $50_{nm2}$. The information identifying which keyswitch is the actuated second keyswitch $50_{nm2}$ is passed on to a host apparatus (not shown in FIG. 1) for further use in operating the host apparatus such as dialing a phone number, entering data or for another function performed by the host apparatus.

If a second keyswitch $50_{nm2}$ has been actuated, control unit 12 proceeds anew as described earlier to await deactuation of second control switch $50_{nm2}$ as indicated by a lagging edge in signal curve 120 and subsequent checking (after a debounce period) whether a third keyswitch $50_{nm3}$ has been actuated. If no second keyswitch $50_{nm2}$ is detected by control unit 12 during interval $t_5$–$t_6$ as having been actuated, control unit 12 returns to a state essentially as exists during time interval $t_0$–$t_1$ to await actuation of a second keyswitch $50_{nm2}$.

The description of operation of system 10 (FIG. 1) in connection with signal curves 120, 150 (FIG. 2) is a representative implementation. One skilled in the art of digital control system design can use the teachings of this disclosure to design a system in which one or both of signal curves 120, 150 deviate from a higher signal level to a lower signal level, or even to different signal levels, in response to conditions in switch array 15. Such changes in signal definitions and consequent logical events by control unit 12 in response to signal variations are regarded as within the scope of the apparatus and method of the present invention so long as control system 12 "awakens" on noticing actuation of a switch in switch array 15, identifies the particular switch activated and returns to "sleep" mode to "reawaken" when deactuation of the switch is noted.

Figure 3:
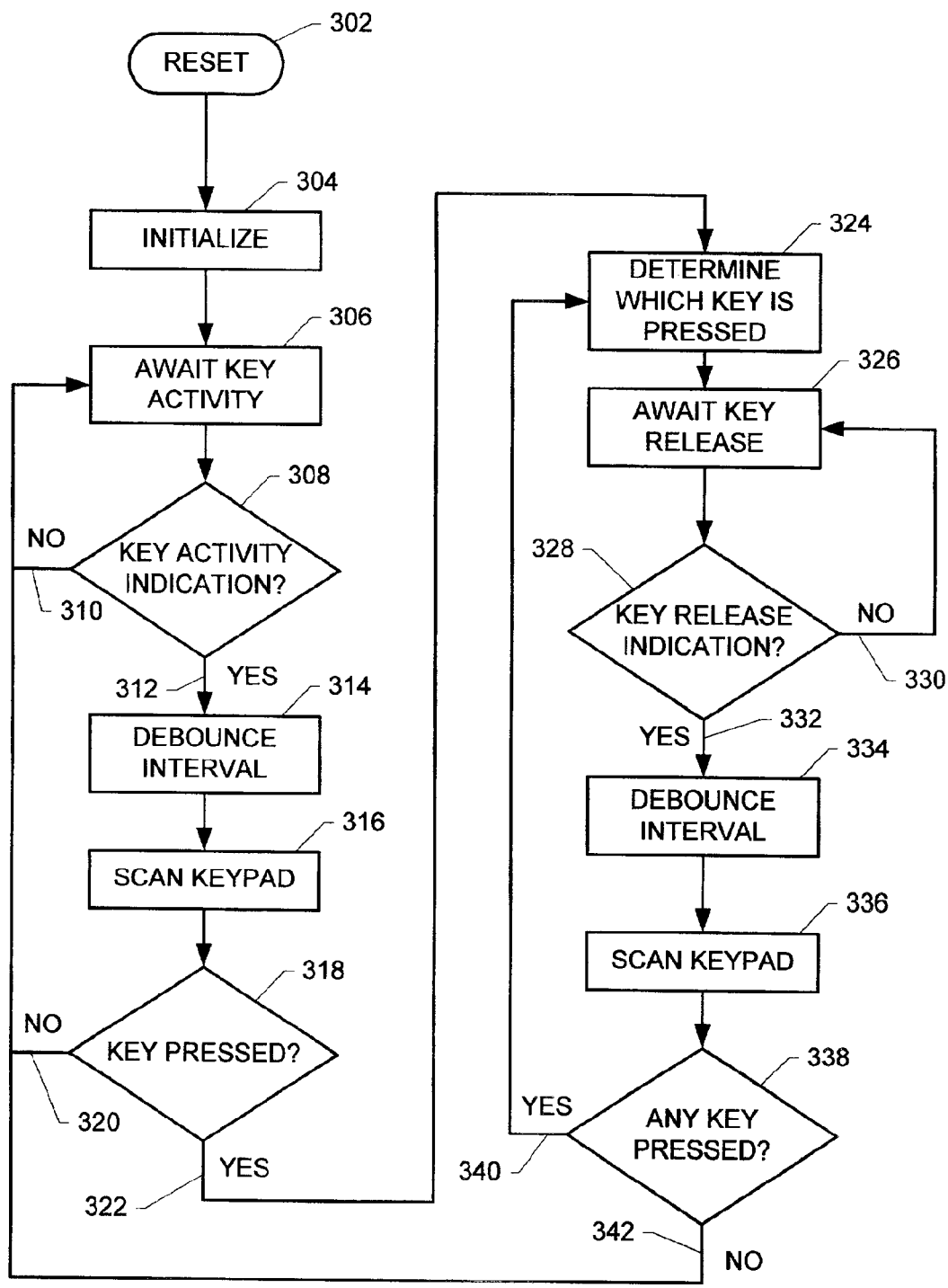
FIG. 3 is a flow diagram illustrating the method of the present invention.

FIG. 3 is a flow diagram illustrating the method of the present invention. In FIG. 3, a method 300 for operating an electrical switching apparatus that includes a plurality of switching devices arranged in a switching array configured to permit sensing of individual switching events by selected switching devices begins at a RESET locus 302. Method 300 continues with an initializing step to ensure that signal levels in the electrical switching apparatus are at proper initial levels, as indicated by a block 304. Method 300 continues by awaiting an indication of key activity in the switching array, as indicated by a block 306. As described earlier in connection with FIGS. 1 and 2, a representative indication of key activity is a leading edge in a particular signal associated with the switch array. Method 300 inquires whether such an indication of key, or switch, activity has occurred, as indicated by a query block 308 posing the query, "Has there been an indication of key activity?"

If there has been no indication of key activity, method 300 proceeds according to NO response line 310 to return to block 306 and method 300 continues to await an indication of key activity. If there has been an indication of key activity, method 300 proceeds according to YES response line 312. A debounce delay interval is imposed by method 300, as indicated by a block 314, to ensure accurate indication by detected signal levels and to guard against erroneous indications that may be occasioned by noise or other spurious signal components.

Method 300 continues by providing power to the switching array for a first time interval after the first switching device is actuated and scanning the switching array, as indicated by a block 316. Method 300 then poses a query, as indicated by a query block 318, whether a key, or switch was actually pressed, or actuated. If no key has been actuated, method 300 proceeds via NO response line 320 to return to awaiting key activity, as indicated by block 306. If a key has been actuated, method 300 proceeds via YES response line 322 and a determination, or identification is made as to which particular switch was depressed, as indicated by a block 324. Method 300 continues by returning to sleep mode, interrupting power to the switching array and awaiting release of the actuated key, as indicated by a block 326. Method 300 poses a query, as indicated by a query block 328, whether there has been a key release indication, (e.g., a lagging edge in signal curve 120; FIG. 2). If there has been no key release indication, method 300 proceeds via NO response line 330 to continue awaiting release of a key, as indicated by block 326. If there is a key release indication, method 300 proceeds via YES response line 332. A debounce delay interval is imposed by method 300, as indicated by a block 334, to ensure accurate indication by detected signal levels and to guard against erroneous indications that may be occasioned by noise or other spurious signal components.

Method 300 continues by providing power to the switching array for a second time interval after the first switching device is actuated and scanning the switching array, as indicated by a block 336. Method 300 then poses a query, as indicated by a query block 338, whether a second key, or switch was actually pressed, or actuated during the time method 300 was awaiting key release (block 326). If a second key has been actuated, method 300 proceeds via YES response line 340 to return to identify which key is the second key depressed, as indicated by block 324. Method 300 continues from that juncture as previously described regarding blocks 328, 334, 336, 338 in connection with the second key actuated. If no second key has been actuated, method 300 proceeds via NO response line 342 to await actuation of a second key according to block 306. Method 300 then proceeds from block 306 in the manner previously described as it relates to actuation of a second key.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims.

I claim:

1. An electrical switching apparatus configured for low power operation; the apparatus comprising:
   (a) a plurality of switching devices; said plurality of switching devices being arranged in a switching array permitting sensing of individual switching events by selected switching devices of said plurality of switching devices;
   (b) a switching control device coupled with said switching array; said control device providing power to said switching array for said sensing and for a first time interval after a first said switching device of said plurality of switching devices is actuated; said control device identifying said first switching device during said first time interval; said control device interrupting power to said switching array after said first time interval until said first switching device is deactuated; said control device providing power to said switching array for a second time interval after said first switching device is deactuated; said control device determining during said second time interval whether a second said switching device of said plurality of switching devices other than said first switching device is actuated.

2. An electrical switching apparatus configured for low power operation as recited in claim 1 wherein said control device responds to a second said switching device of said plurality of switching devices being actuated during said second time interval by identifying said second switching device during said second time interval; said control device interrupting power to said switching array after said second time interval until said second switching device is deactuated.

3. An electrical switching apparatus configured for low power operation as recited in claim 2 wherein said control device responds to no second said switching device of said plurality of switching devices being actuated during said second time interval by restoring power to said switching array after said second time interval.

4. An electrical switching apparatus configured for low power operation as recited in claim 1 wherein said control device responds to no second said switching device of said plurality of switching devices being actuated during said second time interval by restoring power to said switching array after said second time interval.

5. A switching control apparatus for controlling an electrical keyswitch array including a plurality of keyswitches; the apparatus comprising:
   (a) a switching control device coupled with said keyswitch array; said switching control device controlling application of electrical power to said keyswitch array; and
   (b) a sensing device coupled with said keyswitch array; said sensing device cooperating with said switching device to effect periodic sensing of respective keyswitches of said plurality of keyswitches;
   said switching control device providing said electrical power to said keyswitch array for said sensing and during a first time interval after a first keyswitch of said plurality of keyswitches is actuated; said sensing device identifying said first keyswitch during said first time interval; said switching device interrupting power to said keyswitch array after said first time interval until said sensing device senses said first keyswitch is deactuated; said switching device providing said electrical power to said keyswitch array for a second time interval after said first keyswitch is deactuated; said sensing device sensing during said second time interval whether a second said keyswitch of said plurality of keyswitches other than said first keyswitch is actuated.

6. A switching control apparatus for controlling an electrical keyswitch array including a plurality of keyswitches as recited in claim 5 wherein said sensing device responds to a second said keyswitch of said plurality of keyswitches being actuated during said second time interval by identifying said second keyswitch during said second time interval; said switching device responding to said second keyswitch being actuated during said second time interval by interrupting power to said keyswitch array after said second time interval until said second keyswitch is deactuated.

7. A switching control apparatus for controlling an electrical keyswitch array including a plurality of keyswitches as recited in claim 6 wherein said switching device responds to no second keyswitch of said plurality of keyswitches being actuated during said second time interval by restoring power to said keyswitch array after said second time interval.

8. A switching control apparatus for controlling an electrical keyswitch array including a plurality of keyswitches as recited in claim 5 wherein said switching device responds to no second keyswitch of said plurality of keyswitches being actuated during said second time interval by restoring power to said keyswitch array after said second time interval.

9. A method for operating an electrical switching apparatus; said electrical switching apparatus including a plurality of switching devices arranged in a switching array; said switching array being configured to permit sensing of individual switching events by selected switching devices of said plurality of switching devices; the method comprising the steps of:

(a) detecting when a first switching device of said plurality of switching devices is actuated;

(b) providing power to said switching array for said sensing and for a first time interval after said first switching device is actuated;

(c) identifying said first switching device during said first time interval;

(d) interrupting power to said switching array after said first time interval until said first switching device is deactuated;

(e) providing power to said switching array for a second time interval after said first switching device is deactuated; and (f) determining during said second time interval whether a second said switching device of said plurality of switching devices other than said first switching device is actuated.

10. A method for operating an electrical switching apparatus as recited in claim 9 wherein the method comprises the further steps of:

(g) when a second said switching device is actuated during said second time interval, identifying said second switching device during said second time interval; and (h) interrupting power to said switching array after said second time interval until said second switching device is deactuated.

11. A method for operating an electrical switching apparatus as recited in claim 9 wherein the method comprises the further steps of:

(g) when no second said switching device is actuated during said second time interval, restoring power to said switching array after said second time interval.

* * * * *